United States Patent
Ha et al.

(10) Patent No.: US 8,180,588 B2
(45) Date of Patent: May 15, 2012

(54) COMPENSATION METHOD FOR STRUCTURAL DEFORMATION OCCURRING DURING CONSTRUCTION OF SUPER TALL BUILDING

(75) Inventors: Taehun Ha, Anyang-si (KR); Sungho Lee, Seoul (KR); Bohwan Oh, Seoul (KR)

(73) Assignee: Daewoo Engineering & Construction Co., Ltd., Seoul (KR)

( * ) Notice: Subject to any disclaimer, the term of this patent is extended or adjusted under 35 U.S.C. 154(b) by 0 days.

(21) Appl. No.: 13/194,488

(22) Filed: Jul. 29, 2011

(65) Prior Publication Data
US 2012/0036940 A1 Feb. 16, 2012

(30) Foreign Application Priority Data
Aug. 12, 2010 (KR) .................. 10-2010-0077760

(51) Int. Cl.
G01M 5/00 (2006.01)
G01C 25/00 (2006.01)
E04B 1/98 (2006.01)
G06F 19/00 (2011.01)

(52) U.S. Cl. .......... 702/97; 73/786; 73/866.4; 52/167.1; 700/119

(58) Field of Classification Search .............. 702/97, 702/170, 166, 177, 176; 52/167.1–167.9; 73/786; 700/117, 119
See application file for complete search history.

(56) References Cited

U.S. PATENT DOCUMENTS

| 5,065,552 A | * | 11/1991 | Kobori et al. | 52/167.1 |
| 2008/0229684 A1 | * | 9/2008 | Joung et al. | 52/167.4 |
| 2009/0211179 A1 | * | 8/2009 | Willford | 52/167.1 |

FOREIGN PATENT DOCUMENTS

| KR | 10-2005-0090691 | 9/2005 |
| KR | 10-0602832 | 7/2006 |
| KR | 10-2009-0072915 | 7/2009 |

* cited by examiner

*Primary Examiner* — Lisa Caputo
*Assistant Examiner* — Jonathan Dunlap
(74) *Attorney, Agent, or Firm* — Sherr & Vaughn, PLLC

(57) ABSTRACT

The present invention relates to a compensation method for structural deformation occurring during construction of a super tall building, which includes the steps of: selecting horizontal and vertical members predicted to require compensation for horizontal and vertical deformation amounts; calculating deformation amounts based on the casting time of structural concrete for the selected horizontal or vertical members; determining compensation amounts based on the casting time of structural concrete for the selected horizontal or vertical members; calculating deformation amounts of the selected horizontal or vertical members up to and subsequent to the non-structural construction processes; determining compensation amounts by process of the selected horizontal or vertical members; and constructing the selected horizontal or vertical members by floors.

3 Claims, 6 Drawing Sheets

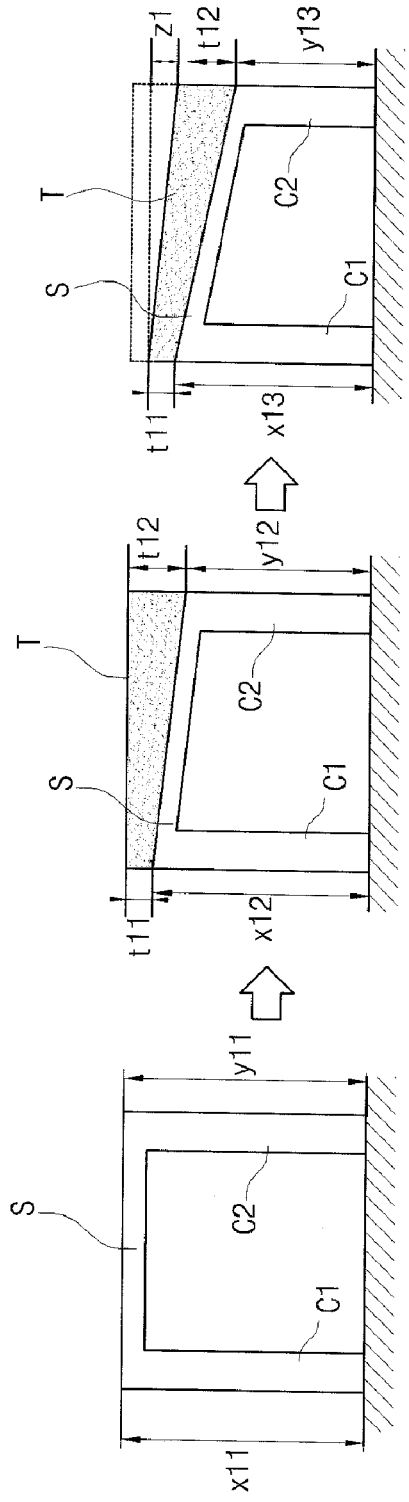
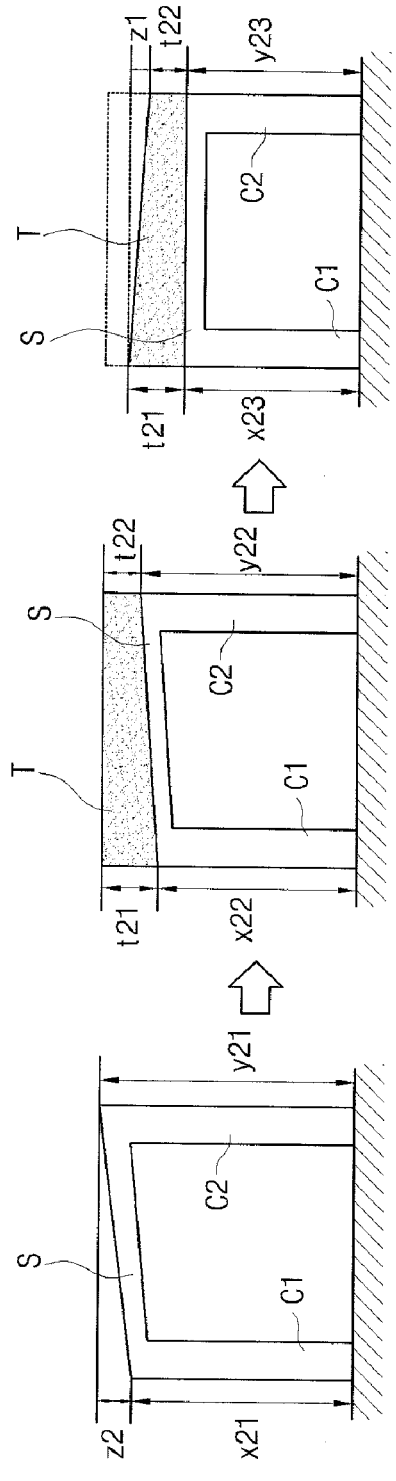
FIG. 6a PRIOR ART
FIG. 6b PRIOR ART
FIG. 6c PRIOR ART
FIG. 7a PRIOR ART
FIG. 7b PRIOR ART
FIG. 7c PRIOR ART

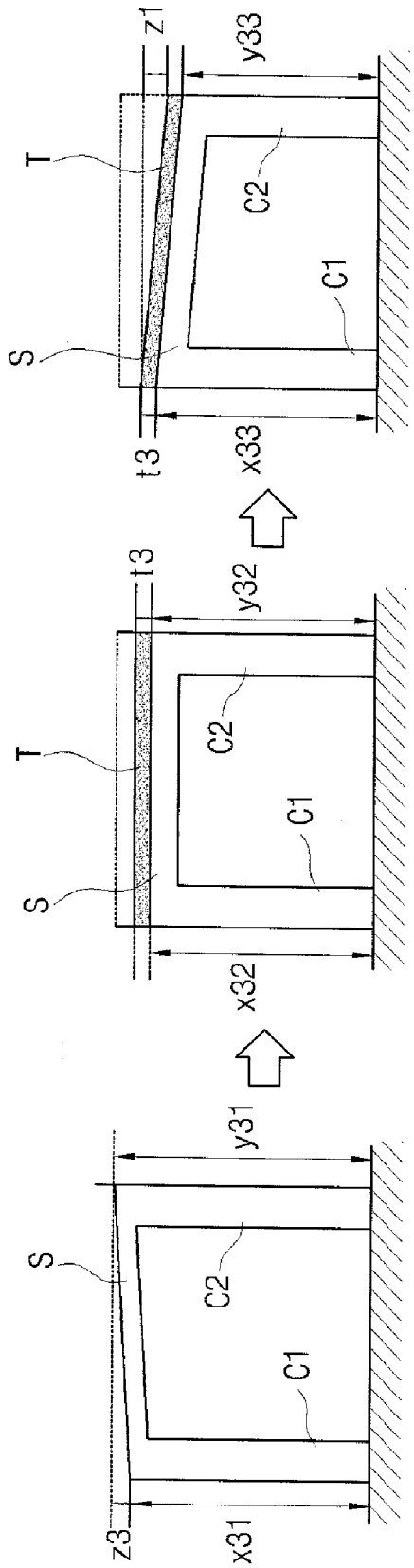

COMPENSATION METHOD FOR STRUCTURAL DEFORMATION OCCURRING DURING CONSTRUCTION OF SUPER TALL BUILDING

CROSS REFERENCE TO PRIOR APPLICATIONS

The present application claims priority under 35 U.S.C. §119 to Korean Patent Application No. 10-2010-0077760 (filed on Aug. 12, 2010), which is hereby incorporated by reference in its entirety.

BACKGROUND OF THE INVENTION

1. Field of the Invention

The present invention relates to a compensation method for structural deformation, and more particularly, to a compensation method for structural deformation occurring during construction of a super tall building.

2. Background of the Related Art

A structure of a building may deform during the construction of the building according to the physical features (e.g., modulus of elasticity, creep, drying shrinkage, and so on) of the materials thereof. Since the deformation of the structure cumulatively increases in proportion to the number of floors of the building, it may occur a lot vertically and horizontally on the upper floors of the super tall building.

Especially, the deformation of the structure occurring during the construction of the super tall building causes the structural performance of the structure to be deteriorated badly and further causes troubles in the performance and construction processes of finishing, mechanical and plumbing (e.g., curtain walls, elevators, floors, partitions, windows, vertical pipes, horizontal pipes, and so on).

Accordingly, a compensation method for the deformation of the structure has been developed and applied at a construction site. In this case, the deformation of the structure is predicted before the construction of the building, and next, during the construction of the structure, the compensation for the structural deformation is carried out to a direction opposite to the direction where the deformation of the structure occurs.

According to the conventional practices, the amount of compensation for the structural deformation is calculated on a basis of a prediction value for structural deformation, and the prediction value is obtained on a basis of specific time called a target date. Generally, the target date becomes the date on which construction is completed or the date after which a period of time is passed after the completion of the construction. That is, the amount of deformation occurring on each floor of the building on the target date is applied to a direction opposite to the direction where the deformation occurs, which becomes theoretical amount of deformation.

FIGS. 1 and 2 are schematic views showing compensation method for structural deformation occurring during construction of a specific level of a super tall building in a conventional practice. As shown in FIG. 1, if no compensation for the structural deformation is carried out, on a basis of the target date on which construction is completed, the amount of shortening x0+y0 of an exterior column C2 may become larger by y0 than the amount of shortening x0 of an interior core C1. In FIGS. 1 and 2, DL means design level, CL construction level, and FL final level after deformation. That is, it is found that a difference between the DL and FL is made.

So as to perform the compensation for the difference, as shown in FIG. 2, the exterior column C2 is constructed higher by the amount of shortening x0+y0 and the interior core C1 is constructed higher by the amount of shortening x0 on the basis of the target date on which construction is completed. As a result, a theoretical difference between the DL and FL is not made after the structural deformation occurs.

As well known, the compensation for the structural deformation on the basis of the time on which the construction is completed is divided into a compensation method for all of the deformation occurring on the respective portions of the building (total deformation) and compensation method for only deformation occurring by a difference between a specific portion of the building and a portion adjacent to the specific portion (relative deformation or differential deformation).

FIG. 3 is a flow chart showing an algorithm of a prediction method for axial shortening in a super tall building according to a conventional practice. As shown in FIG. 3, according to the conventional practice, if the super tall building has n floor slabs, the conventional prediction method includes the steps of calculating the amount of shortening before casting and the amount of shortening subsequent to casting on a basis of the slab casting time for each floor (i-th floors). The conventional compensation method determines the amount of compensation for the structural deformation in accordance with the amount of shortening before casting and the amount of shortening subsequent to casting obtained from the above step.

However, the conventional compensation method for the structural deformation does not provide any improvement in the decrease of the structural performance of the structure. Even if the compensation for the structural deformation is carried out on the basis of the construction completion time, the structural deformation still occurs during the construction, and therefore, stress developed in the structure due to differential deformation does not disappear.

Moreover, the conventional compensation method for the structural deformation does not remove the troubles occurring in construction processes of finishing, mechanical and plumbing. The construction processes of finishing, mechanical and plumbing are performed a little later after the construction of the structure, and generally, they are carried out on a state where their plumb and levelness are adjusted separately from the plumb and levelness of the structure. Otherwise, the processes are carried out by using self-leveling materials.

However since the amount of compensation for the structural deformation in the conventional compensation method is calculated on the basis of the target date on which the construction is completed, the plumb and levelness adjusted during the construction processes of finishing, mechanical and plumbing are misaligned to a direction opposite thereto, thereby causing the same problems as when no compensation for the structural deformation is performed.

Furthermore, since the conventional compensation for the structural deformation is limited only to the deformation of vertical members, it is not adequate for the complex structural deformation of a super tall building having an asymmetric structure.

SUMMARY OF THE INVENTION

Accordingly, the present invention has been made in view of the above-mentioned problems occurring in the prior art, and it is an object of the present invention to provide a compensation method for structural deformation occurring during construction of a super tall building in such a way that the compensation is done in a precise manner, the construction of the super tall building is easily performed, and the construction costs and material costs are reduced.

To accomplish the above object, according to the present invention, there is provided a compensation method for structural deformation occurring during construction of a super tall building that includes the steps of: selecting horizontal and vertical members predicted to have compensation for horizontal and vertical deformation amounts through structural analysis considering construction sequence and time-dependent properties of concrete for the super tall building having a plurality of horizontal and vertical members constituting a structure thereof; calculating deformation amounts based on the casting time of the selected horizontal or vertical members through the structural analysis considering construction sequence and time-dependent properties of concrete on a basis of the casting time of structural concrete on which concrete casting is performed on the structure of the respective floors; determining compensation amounts based on the casting time of the selected horizontal or vertical members in accordance with the deformation amounts based on the casting time; on a basis of non-structural construction processes performed after the casting time of structural concrete at respective floors, calculating deformation amounts of the selected horizontal or vertical members before and after the non-structural construction processes through the structural analysis considering construction sequence and time-dependent properties of concrete; determining compensation amounts by process of the selected horizontal or vertical members in accordance with the calculated deformation amounts of the selected horizontal or vertical members before and after the non-structural construction processes; and constructing the selected horizontal or vertical members by floor in accordance with the compensation amounts based on the casting time and the compensation amounts by process.

According to the present invention, the horizontal members may include slabs, beams and girders, and the vertical members include columns and walls.

According to the present invention, the non-structural construction process may include finishing, mechanical and plumbing.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIGS. 6a to 6c are schematic views showing the structural deformation occurring when no compensation for the structural deformation is applied;

FIGS. 7a to 7c are schematic views showing the structural deformation occurring when the conventional compensation method is applied; and FIGS. 8a to 8c are schematic views showing the structural deformation occurring when the compensation method of FIG. 4 is applied.

DETAILED DESCRIPTION OF THE PREFERRED EMBODIMENT

Figure 1:
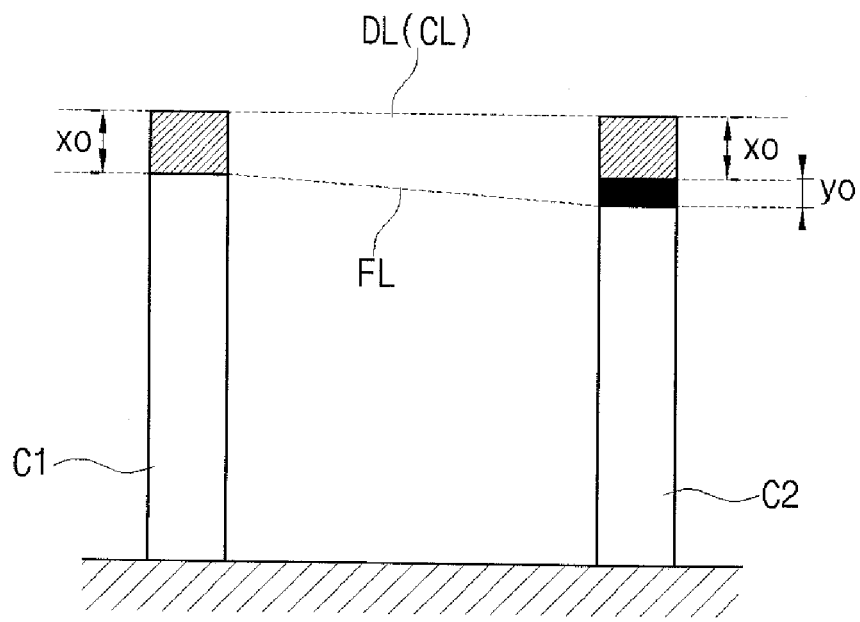
FIGS. 1 and 2 are schematic views showing a compensation method for structural deformation occurring during construction of a specific level of a super tall building in a conventional practice.
Figure 2:
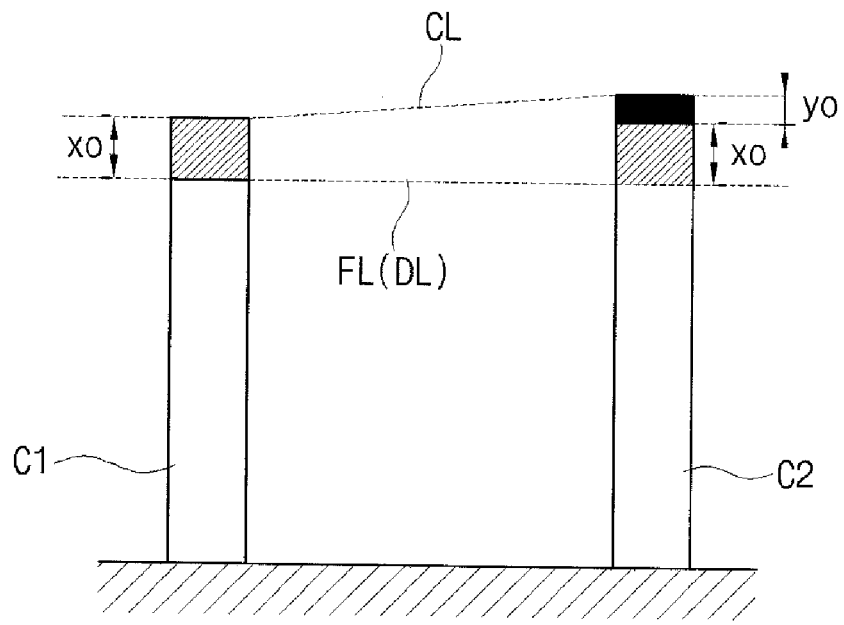

Hereinafter, an explanation on a compensation method for structural deformation occurring during construction of a super tall building according to a preferred embodiment of the present invention will be given in detail with reference to the attached drawing.

In the preferred embodiment of the present invention, it is noted that the same components and parts as each other are denoted with the same reference numerals in the drawings, and also, a detailed explanation of the functions and structures of generally known components or parts will be avoided for the brevity of the description. Under the same reason as above, furthermore, some parts of the present invention are oversized, removed, or roughly shown in the drawings.

Figure 4:
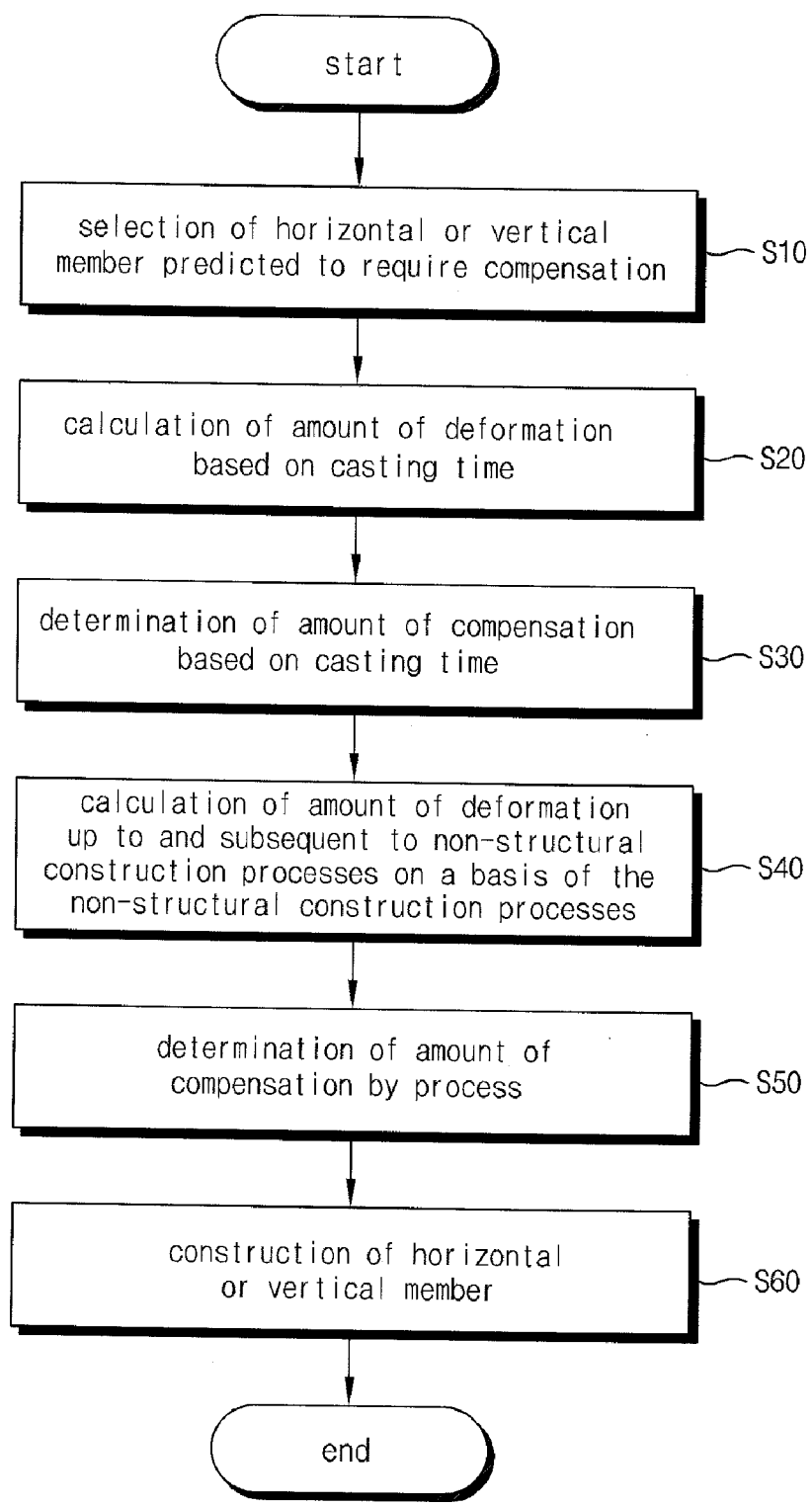
FIG. 4 is a flow chart showing a compensation method for structural deformation occurring during construction of a super tall building according to the present invention.
Figure 5:
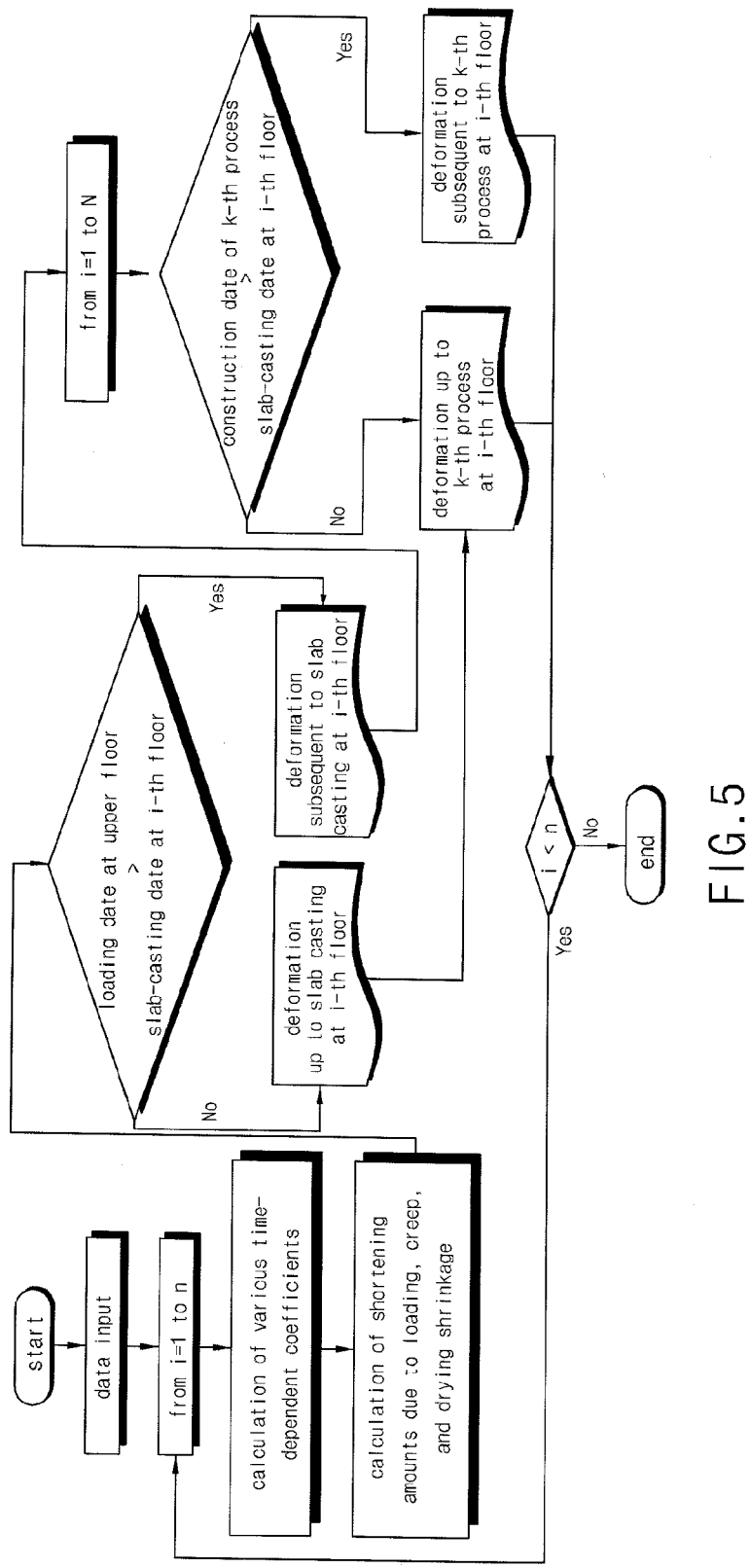
FIG. 5 is a flow chart showing an algorithm of predicting structural deformation according to FIG. 4.

FIG. 4 is a flow chart showing a compensation method for structural deformation occurring during construction of a super tall building according to the present invention, FIG. 5 is a flow chart showing an algorithm of predicting structural deformation according to FIG. 4, FIGS. 6a to 6c are schematic views showing the structural deformation occurring when no compensation for the structural deformation is applied, FIGS. 7a to 7c are schematic views showing the structural deformation occurring when the conventional compensation method is applied, and FIGS. 8a to 8c are schematic views showing the structural deformation occurring when the compensation method of FIG. 4 is applied.

Referring to FIG. 4, a compensation method for structural deformation occurring during construction of a super tall building includes steps S10 to S60.

At step S10, first, horizontal or vertical members are selected, and in this case, they are predicted to require compensation for horizontal and vertical deformation amounts through construction stage analysis on a basis of the design materials of the super tall building having a plurality of horizontal and vertical members constituting structure thereof. In this case, the horizontal members include slabs, beams, girders, and so on, and the vertical members include columns, walls, and so on.

At step S20, next, deformation amounts based on the casting time of the selected horizontal or vertical members are calculated through the structural analysis considering construction sequence and time-dependent properties of concrete on a basis of the casting time of structural concrete on which concrete casting is performed on the structure of the respective floors of the super tall building. The deformation amounts include elastic deformation amounts, creep deformation amounts, and drying shrinkage amounts of the respective horizontal or vertical members.

At step S30, after that, compensation amounts based on the casting time of the selected horizontal or vertical members are calculated in accordance with the deformation amounts based on the casting time.

At step S40, on a basis of the non-structural construction processes performed after the casting time of structural concrete at respective floors, deformation amounts of the selected horizontal or vertical members up to and subsequent to the non-structural processes are calculated through the structural analysis considering construction sequence and time-dependent properties of concrete. In this case, the deformation amounts include elastic deformation amounts, creep deformation amounts, and drying shrinkage amounts of the respective horizontal or vertical members.

Also, the non-structural construction processes include finishing, mechanical an plumbing. The finishing, mechanical and plumbing include curtain walls, elevators, floors, partitions, windows, vertical pipes, horizontal pipes, and so on.

At step S50, compensation amounts by process of the selected horizontal or vertical members are determined in accordance with the deformation amounts of the selected horizontal or vertical members up to and subsequent to the non-structural construction processes.

Next, at step S60, the selected horizontal or vertical members are constructed by floor in accordance with the compensation amounts based on the casting time and the compensation amounts by process.

Figure 3:
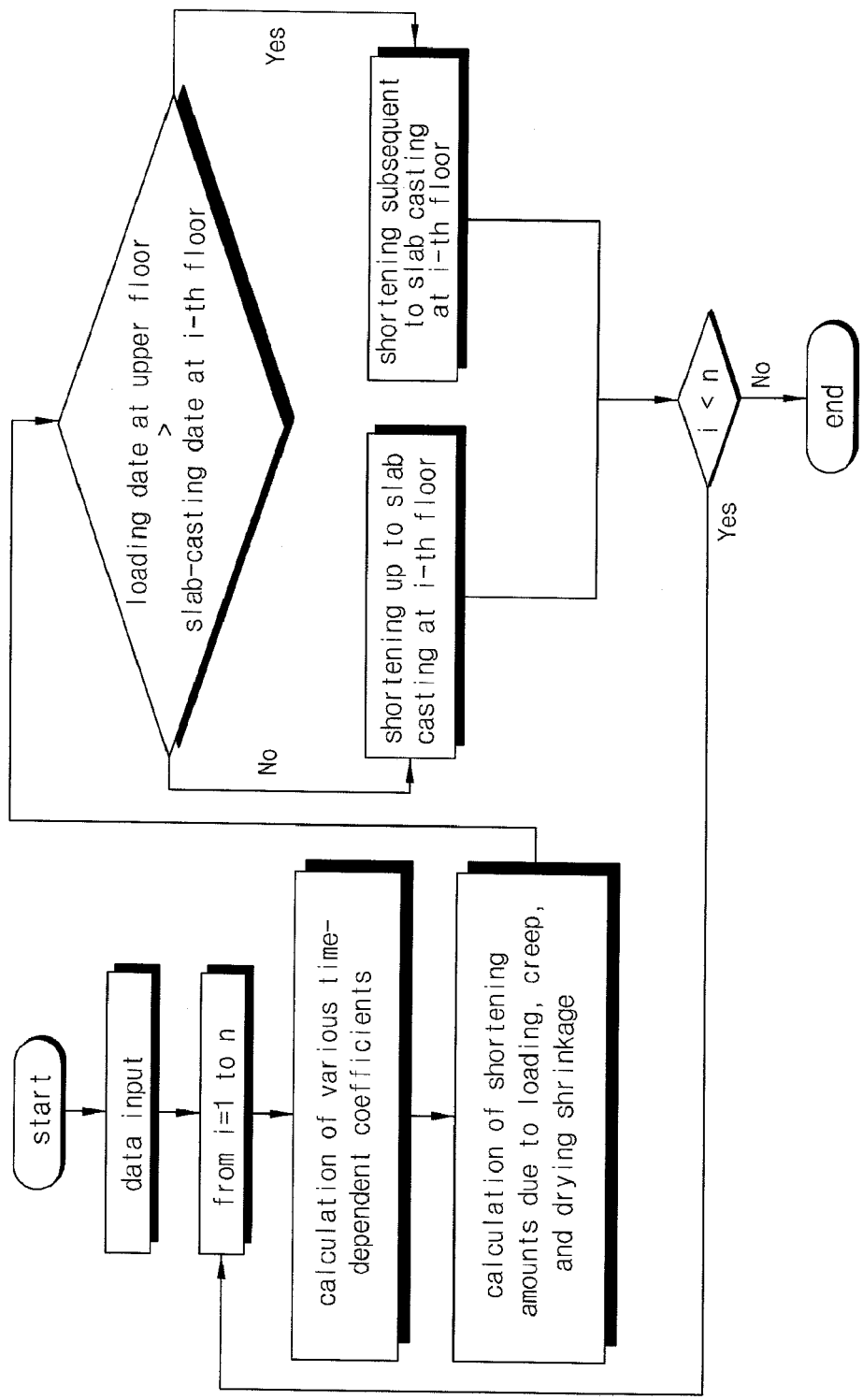
FIG. 3 is a flow chart showing an algorithm of a prediction method for axial shortening in a super tall building according to a conventional practice.

FIG. 5 is a flow chart showing an algorithm of predicting structural deformation according to FIG. 4. As shown in FIG. 3, the conventional method for predicting the structural deformation includes the step of calculating the deformation amounts occurring only up to the target date (for example, the date on which the construction is completed) on the basis of the slab casting carried out on the respective floors, so that the deformation amounts by process cannot be obtained at all or a lot of iterative calculations need to be performed.

As shown in FIG. 5, however, under the algorithm of predicting structural deformation according to the present invention, the deformation amounts of the horizontal or vertical members are calculated by floor on the basis of the casting time of structural concrete, and next, the deformation amounts subsequent to the casting of structural concrete are divided again on the basis of the time on which the non-structural construction processes are performed, thereby obtaining the deformation amounts up to and subsequent to the non-structural construction processes. At this time, since the deformation amounts at i-th floors of the building are calculated independently of the time on which the k-th process is performed, the time on which the non-structural construction processes are performed is calculated as a plurality of target dates.

Referring to FIGS. 6a to 8c, an explanation on the effects of the compensation methods for the structural deformation in terms of the performance of the non-structural construction processes shall be given in detail. In this case, the example of the non-structural construction process is a floor-finishing process.

First, FIGS. 6a to 6c show the structural deformation occurring when no compensation for the structural deformation is made. If no compensation for the structural deformation is made, as shown in FIG. 6a, an exterior column C2 is constructed to have a height y11, which is equal to the height x11 of an interior core C1. For the convenience of the description, the exterior column C2 and the interior core C1 are just used as examples of the vertical members of the super tall building, and therefore, the present invention is not limited to them.

After that, on the floor-finishing time, the exterior column C2 will have a height y12, which is lower than the height x12 of the interior core C1 as a result of relative deformation amounts (differential shortening amounts), as shown in FIG. 6b, and in this state, floor-finish T is cast horizontally on slab S. The finish of the floor T is required to have a minimum thickness, and therefore, if the horizontal level is automatically adjusted during the finishing process of the floor T, the thickness of the floor T needs to be formed thicker in a partial section thereof than a required finishing thickness of the floor T. That is, the floor T has a thickness difference between t11 and t12. This means that the amount of materials required for finishing the floor T undesirably increases. Furthermore, since the floor T is cast horizontally on the slant slab S, it is hard to perform the finishing work.

When the construction is completed, the exterior column C2 has a height y13, which is lower than the height x13 of the interior core C1, as shown in FIG. 6c, and the top surface of the floor T cannot have a flat horizontal level and has a height difference z1 between both ends. That is, when the construction is completed, a given degree of inclination, which is lower than the degree of inclination of the slab S, is formed on the finishing surface of the floor T.

Next, FIGS. 7a to 7c show the structural deformation occurring when the compensation for the structural deformation is made on the basis of the completion time of construction.

First, as shown in FIG. 7a, so as to perform the compensation on the basis of the completion time of construction, the exterior column C2 is built higher than the interior core C1 by a shortening difference z2 between the exterior column C2 and the interior core C1. That is, the height y21 of the exterior column C2 is higher than the height x21 of the interior core C1 by the amount of z2. The amount z2 is larger than the amount z1.

After that, on the floor-finishing time, the exterior column C2 has a height y22, which is lower than before, but is still higher than the height x22 of the interior core C1, as shown in FIG. 7b. In this state, the floor T is cast horizontally on the slab S. The finish of the floor T is required to have a minimum thickness, and therefore, if the horizontal level is automatically adjusted during the finishing process of the floor T, the thickness of the floor T needs to be formed thicker in a partial section thereof than a required finishing thickness of the floor T. That is, the floor T has a thickness difference between t21 and t22. This means that the amount of materials required for finishing the floor T undesirably increases. Furthermore, since the floor T is cast horizontally on the slant slab S, it is hard to perform the finishing work.

When the construction is completed, although the exterior column C2 has a slab height y23, which is equal to the slab height x23 of the interior core C1, as shown in FIG. 7c, the top surface of the floor T does not have a flat horizontal level and has a height difference z1 between both ends. That is, when the construction is completed, the slab S has a flat horizontal level, but a given inclination, which is the same as the given inclination in case where no compensation is performed, is formed on the finishing surface of the floor T.

Lastly, FIGS. 8a to 8c show the structural deformation occurring when the compensation for the structural deformation is made on the basis of the floor-finishing time.

First, as shown in FIG. 8a, so as to perform the compensation, the exterior column C2 is built higher than the interior core C1 by a shortening difference z3 between the exterior column C2 and the interior core C1. That is, the height y31 of the exterior column C2 is higher than the height x31 of the interior core C1 by the amount of z3. The amount z3, which is the differential shortening on floor-finishing time, is smaller than the amount z2, which is the differential shortening on the completion time of construction.

After that, on the floor-finishing time, the exterior column C2 has a height y32, which is equal to the height x32 of the interior core C1 in terms of a relative deformation amounts (a zero-differential shortening), as shown in FIG. 8b. In this state, the floor T is cast horizontally on the slab S. In this case, since the compensation was made to allow the height of the interior core C1 and that of the exterior core C2 to be equal to each other on the finishing time of the floor T, it is possible to perform the finishing work of the floor T to have a constant thickness on the horizontal slab S. The structure has a horizontal level on the floor-finishing time, thereby making the construction easy and preventing the amount of materials required for finishing the floor T from increasing.

When the construction is completed, the exterior column C2 has a height y33, which is lower than the height x33 of the interior core C1, as shown in FIG. 8c, and the top surface of the floor T does not have a flat horizontal level and has a height difference z1 between both ends. That is, when the construction is completed, a given degree of inclination occurs both at the top surface of the floor T and the soffit of slab S. Although this inclination is inevitable, the degree can be further minimized by adjusting the floor-finishing time, i.e., the later the floor-finishing time, the less degree of inclination.

According to the present invention, the compensation method for the structural deformation on the basis of the non-structural construction process time is described with the examples of the floor-finishing process and the vertical members, but it is not limited thereto. That is, the compensation method according to the present invention can also be applied to the horizontal members and to various non-structural construction processes, such as curtain walls, elevators, floors, partitions, windows, vertical pipes, horizontal pipes, and so on.

As described above, according to the preferred embodiment of the present invention, the deformation amounts of the super tall building are calculated on the basis of the casting time of structural concrete at respective floors to obtain the deformation amounts based on the casting time, and the deformation amounts up to the non-structural construction processes and the deformation amounts subsequent to the non-structural construction processes are calculated on the basis of the non-structural construction process time, such that since the horizontal and vertical members are built in accordance with the compensation amounts based on the casting time and the compensation amounts by process that are obtained based on the deformation amounts as mentioned above, the compensation for the structural deformation of the super tall building can be performed precisely, making the construction easy and reducing the finishing costs and the material costs.

Additionally, since the deformation amounts for both of the horizontal and vertical members are calculated at the same time, the present invention can be applied to a super tall building having an asymmetrical structure as well as a symmetrical structure.

Furthermore, since the horizontal or vertical members are built in accordance with the compensation amounts by process obtained based on the deformation amounts up to and subsequent to the respective individual non-structural construction processes performed after the casting time of structural concrete at respective floors, the compensation for the structural deformation can be performed in consideration of the individual deformation amounts caused by performing the respective non-structural construction processes.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A compensation method for structural deformation occurring during construction of a super tall building, the compensation method comprising the steps of:
    selecting horizontal and vertical members predicted to require compensation for horizontal and vertical deformation amounts through structural analysis considering construction sequence and time-dependent properties of concrete for the super tall building having a plurality of horizontal and vertical members constituting structure thereof;
    calculating deformation amounts based on the casting time of the selected horizontal or vertical members through the structural analysis considering construction sequence and time-dependent properties of concrete on a basis of the casting time of structural concrete on which concrete casting is performed on the structure of the respective floors;
    determining compensation amounts based on the casting time of the selected horizontal or vertical members in accordance with the deformation amounts based on the casting time;
    on a basis of non-structural construction processes performed after the casting time of structural concrete at respective floors, calculating deformation amounts of the selected horizontal or vertical members up to and subsequent to the non-structural construction processes through the structural analysis considering construction sequence and time-dependent properties of concrete;
    determining compensation amounts by process of the selected horizontal or vertical members in accordance with the calculated deformation amounts of the selected horizontal or vertical members up to and subsequent to the non-structural construction processes; and
    constructing the selected horizontal or vertical members by floors in accordance with the compensation amounts based on the casting time and the compensation amounts by process.

2. The compensation method according to claim 1, wherein the horizontal members include slabs, beams and girders, and the vertical members include columns and walls.

3. The compensation method according to claim 1, wherein the non-structural construction processes include finishing, mechanical and plumbing.

* * * * *